(12) United States Patent
Hu et al.

(10) Patent No.: US 12,745,661 B2
(45) Date of Patent: Sep. 22, 2026

(54) SCALABLE EXTREME LARGE SIZE SUBSTRATE INTEGRATION

(71) Applicant: Apple Inc., Cupertino, CA (US)

(72) Inventors: Kunzhong Hu, Cupertino, CA (US); Chonghua Zhong, Cupertino, CA (US); Jiongxin Lu, Cupertino, CA (US); Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 774 days.

(21) Appl. No.: 17/815,893

(22) Filed: Jul. 28, 2022

(65) Prior Publication Data

US 2023/0017445 A1 Jan. 19, 2023

Related U.S. Application Data

(63) Continuation of application No. 16/729,094, filed on Dec. 27, 2019, now Pat. No. 11,404,337.

(51) Int. Cl.

| | |
|---|---|
| ***H10W 70/695*** | (2026.01) |
| ***H10W 72/00*** | (2026.01) |
| ***H10W 72/20*** | (2026.01) |
| ***H10W 74/00*** | (2026.01) |
| ***H10W 74/01*** | (2026.01) |
| ***H10W 90/00*** | (2026.01) |

(52) U.S. Cl.

CPC ..... *H10W 70/695* (2026.01); *H10W 72/0198* (2026.01); *H10W 72/20* (2026.01); *H10W 74/00* (2026.01); *H10W 74/016* (2026.01); *H10W 90/00* (2026.01); *H10W 72/072* (2026.01)

(58) Field of Classification Search

CPC ..... H01L 23/145; H01L 21/565; H01L 23/28; H01L 23/488; H01L 24/14; H01L 24/94; H01L 25/0655; H01L 2021/60022; H01L 2224/16225; H01L 23/5383; H01L 23/5385; H01L 23/3128; H01L 23/49816; H01L 2221/68345; H01L 2221/68359; H01L 21/6835; H10W 70/695; H10W 72/0198; H10W 72/20; H10W 74/00; H10W 74/016; H10W 90/00; H10W 72/072

See application file for complete search history.

(56) References Cited

U.S. PATENT DOCUMENTS

| | | | |
|---|---|---|---|
| 7,642,633 B2 | 1/2010 | Hirose et al. | |
| 9,324,626 B2 | 4/2016 | Shen et al. | |
| 9,443,824 B1 | 9/2016 | We et al. | |
| 9,966,300 B1 | 5/2018 | Kelly et al. | |
| 2015/0061095 A1* | 3/2015 | Choi | H01L 23/5385 257/777 |

(Continued)

OTHER PUBLICATIONS

Miyairi, K., "Organic Interposer, 2.5D Structure Like, Development for MCM and Heterogeneous Packaging" SKO-i-THOP 18-070, SiP Conference China 2018, Oct. 17-19, 2018, 14 pgs.

*Primary Examiner* — Zandra V Smith
*Assistant Examiner* — Corbyn D Mellinger
(74) *Attorney, Agent, or Firm* — Aikin & Gallant, LLP

(57) ABSTRACT

Electronic packages and methods of formation are described in which an interposer is solderlessly connected with a package substrate. The interposer may be stacked on the package substrate and joined with a conductive film, and may be formed on the package substrate during a reconstitution sequence.

14 Claims, 9 Drawing Sheets

(56) References Cited

U.S. PATENT DOCUMENTS

| | | | |
|---|---|---|---|
| 2016/0064320 | A1 | 3/2016 | Li et al. |
| 2018/0182707 | A1 | 6/2018 | Elsherbini et al. |
| 2019/0035749 | A1 | 1/2019 | Dalmia et al. |
| 2019/0103373 | A1 | 4/2019 | Hirai |
| 2019/0219613 | A1* | 7/2019 | Bae .................. H01L 23/49894 |
| 2020/0006241 | A1 | 1/2020 | Wu et al. |
| 2020/0066639 | A1 | 2/2020 | Lee et al. |
| 2020/0098621 | A1 | 3/2020 | Bharath et al. |
| 2020/0205300 | A1 | 6/2020 | Wu |
| 2020/0243448 | A1* | 7/2020 | Qian .................. H01L 21/4853 |
| 2020/0388600 | A1* | 12/2020 | Huang ................ H05K 3/4688 |
| 2021/0082830 | A1 | 3/2021 | Lee et al. |
| 2021/0193519 | A1 | 6/2021 | Aleksov et al. |
| 2021/0193544 | A1 | 6/2021 | Lin et al. |
| 2021/0225699 | A1 | 7/2021 | Tseng et al. |

* cited by examiner 100
302
304
130
130
130
110
212
216
214
102
202
240
250

202
202
202
400

102
120
240
400

130
102
240
400

100
100
100
240
400

SCALABLE EXTREME LARGE SIZE SUBSTRATE INTEGRATION

RELATED APPLICATIONS

This application is a continuation of co-pending U.S. patent application Ser. No. 16/729,094, filed Dec. 27, 2019, which is incorporated herein by reference.

BACKGROUND

Field

Embodiments described herein relate to electronic packaging, and more particularly to solderless interposer connections.

Background Information

Substrate yield, layer count and performance are some of the concerns associated with high performance computing applications. Various 2.XD like packaging solutions have been developed to address these concerns in which an interposer is located between a package substrate and one or more dies mounted on the interposer. The interposer may include finer line widths than is possible with traditional package substrate formation, such as cored substrate. Interposers can be constructed of different materials depending upon application, including silicon, glass, and organic.

SUMMARY

Electronic packages and methods of formation are described in which an interposer is solderlessly connected with a package substrate. In an embodiment, a method of forming an electronic package includes placing a plurality of package substrates on a carrier substrate, optionally encapsulating the plurality of package substates in a molding compound layer, solderlessly connecting a plurality of organic interposers to the plurality of package substrates, and mounting one or more dies on each interposer.

In an embodiment, the interposer is stacked on the package substrate and joined with a conductive film. For example, an electronic package may include a package substrate, a bottom side of an interposer bonded to the package substrate with a conductive film to electrically connect a plurality of contact pads of the interposer to a corresponding plurality of landing pads of the package substrate, and one or more dies bonded to a top side of the interposer. In an embodiment the interposer is stacked on the package substrate during a reconstitution sequence.

In an embodiment the interposer is formed on the package substrate during a reconstitution sequence. In an embodiment, and electronic package includes a package substrate and an interposer on the package substrate. A dielectric film can be between the package substrate and the interposer, with a plurality of conductive columns extending through the dielectric film to directly connect a plurality of contact pads of the interposer to a corresponding plurality of landing pads of the package substrate. One or more dies may be bonded to a top side of the interposer.

DETAILED DESCRIPTION

Figure 1A:
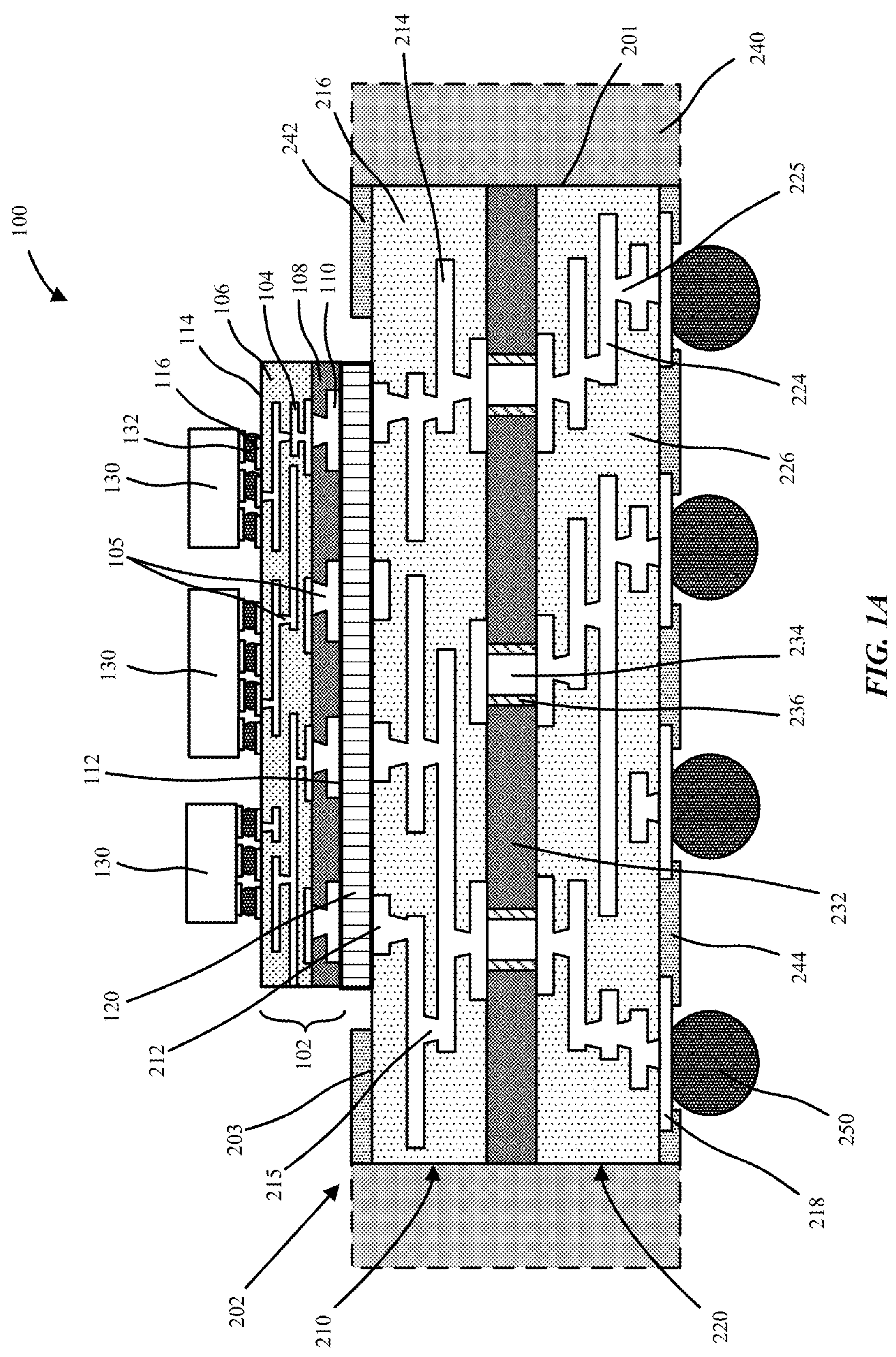
FIG. 1A is a schematic cross-sectional side view illustration of an electronic package including an interposer connected to a package substrate with a conductive film in accordance with an embodiment.

Embodiments describe electronic packages and methods of fabrication which include solderless connection of an interposer to a package substrate. In accordance with some embodiments the interposer is an organic interposer. For example, the organic interposer may include a plurality of metal interconnect lines and a plurality of polymer dielectric layers. Organic interposers may provide a more cost-sensitive integration option compared to more conventional silicon or glass interposers. In accordance with embodiments, the organic interposers are connected to the package substrate using a solderless connection. For example, this may be with a conductive film, such as an anisotropic conductive film (ACF) or an embedded pin array film. Solderless connection can also be achieved by formation of the organic interposers in a layer-by-layer process directly on the package substrates during a substrate reconstitution process. Solderless connection may avoid issues associated with solder, including joint yield and reliability, size scalability, pitch scalability, and power integrity performance.

In an embodiment, an electronic package includes a package substrate, a bottom side of an (e.g. organic) interposer bonded to the package substrate with a conductive film to electrically connect a plurality of contact pads of the interposer to a corresponding plurality of landing pads of the package substrate, and one or more dies bonded to a top side of the interposer.

In an embodiment, an electronic package includes a package substrate, an interposer on the package substrate, and one or more dies bonded to a top side of the interposer. A dielectric film may be located between the package substrate and the interposer with plurality of conductive columns extending through the dielectric film to directly connect a plurality of contact pads of the interposer to a corresponding plurality of landing pads of the package substrate. In an embodiment, a plurality of contact pads of the interposer is formed directly on a plurality of landing pads of the package substrate.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", and "on" as used herein may refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1A a schematic cross-sectional side view illustration is provided of an electronic package 100 including an interposer 102 connected to a package substrate 202 with a conductive film 120 in accordance with an embodiment. As illustrated, the electronic package 100 includes a package substrate 202, and a bottom side 112 of an interposer 102 bonded to the package substrate 202 with a conductive film 120 to electrically connect a plurality of contact pads 110 of the interposer 102 to a corresponding plurality of landing pads 212 of the package substrate 202. One or more dies 130 are bonded to a top side 114 of the interposer 102. For example, the dies 130 may be bonded to a plurality of landing pads 116 of the interposer 102 with a plurality of solder bumps 132.

The interposer 102 in accordance with embodiments may be an organic interposer. For example, such an organic interposer 102 can include a plurality of metal redistribution lines 104 and a plurality of polymer dielectric layers 106. The metal redistribution lines 104 can be connected by vias 105. The interposer 102 may be formed using a layer-by-layer thin film processing sequence, such as lamination of the polymer dielectric layers 106, followed by patterning and deposition of the metal redistribution lines 104 and vias 105. The interposer 102 may optionally include a rigid layer 108 to provide structural integrity to the interposer 102. Vias 105 may also be formed through the rigid layer 108. In an embodiment, rigid layer 108 is thicker than the individual organic dielectric layers 106. Rigid layer 108 may be formed of the same or different material than the dielectric layers 106.

The package substrate 202 may be a variety of substrates including traditional substrates such as ABF (Ajinomoto Build-up Film), metal or metal core substrates, silicon core substrates, ceramics, polymers, FR-2 (a phenolic paper impregnated with resin), FR-4 (a woven fiberglass impregnate with resin), etc. The package substrate 202 may be rigid or flexible. The particular embodiment illustrated in FIG. 1A includes a cored package substrate 202, though this is exemplary, and embodiments are not so limited. As shown, the package substrate 202 may optionally include a core 232 including vias 234 connected a top build-up structure 210 and a bottom build-up structure 220. Core 232 may be formed of a variety of insulating or electrically conductive materials to provide rigidity. When the core is formed of an electrically conductive material vias 234 may be insulated from the core 232 with an insulation layer 236.

The build-up structures 210, 220 may both include metal redistribution lines 214, 224, vias 215, 225 and dielectric layers 216, 226. A top surface 203 of the package substrate 202 may be the top surface of the top build-up structure 210 any may include landing pads 212. Contact pads 218 may be on a bottom side of the bottom build-up structure 220. As shown, a solder mask layer 242 may be formed on top of the top build-up structure 210 and patterned to form an opening to receive the interposer 102. A solder mask layer 244 can be formed on the bottom surface of the bottom build-up structure 220 and patterned to expose contact pads 218, which may include solder bumps 250 applied thereto for bonding to a circuit board, etc.

The package substrate 202 in accordance with embodiments may optionally be embedded in a molding compound layer 240, which laterally surrounds side edges 201 of the package substrate 202. Encapsulation with the molding compound layer 240 may be attributed to reconstitution during the assembly process in which a plurality of package substrates 202 are molded to form a reconstituted substrate prior to addition of the interposers and dies.

Figure 1B:
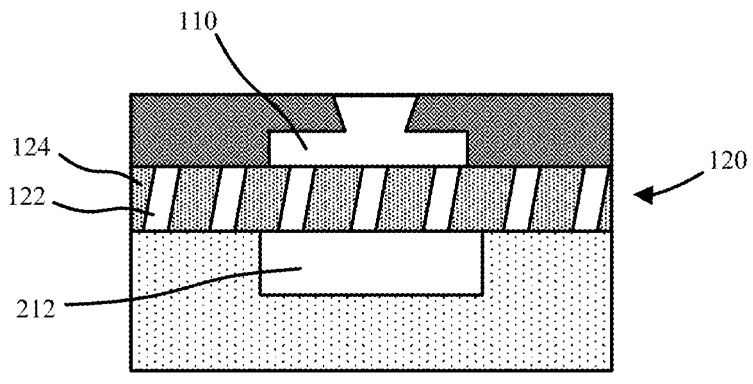
FIG. 1B is a close-up schematic cross-sectional side view illustration of an embedded pin array conductive film in accordance with an embodiment.
Figure 1C:
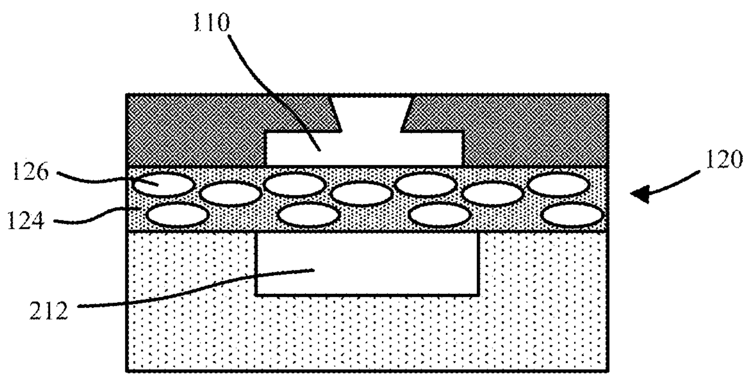
FIG. 1C is a close-up schematic cross-sectional side view illustration of an anisotropic conductive film in accordance with an embodiment.

The conductive film 120 in accordance with embodiments may be formed using various solutions. In an embodiment, the conductive film 120 is an embedded pin array. As illustrated in the close-up schematic cross-sectional side view illustration of FIG. 1B, an embedded pin array conductive film may include an array of pins 122 (e.g. copper pins) embedded in a matrix 124 (e.g. adhesive insulator). The pins 122 in the array of pins may be separated by a pin pitch (e.g. less than 100 microns) that is less than a minimum contact pad pitch between the plurality of contact pads 110 of the interposer. In an embodiment, a matching ratio includes 2-4 pins per contact pad 110. Similar ratios can be maintained with landing pads 212. In an embodiment, the conductive film 120 is an anisotropic conductive film (ACF). As illustrated in the close-up schematic cross-sectional side view illustration of FIG. 1C, and ACF may include conductive particles 126 embedded in a matrix 124 to create electrical connection between the determined locations (e.g. the contact pads 110 of the interposer 102 and landing pads 212 of the package substrate 202.

Figure 2:
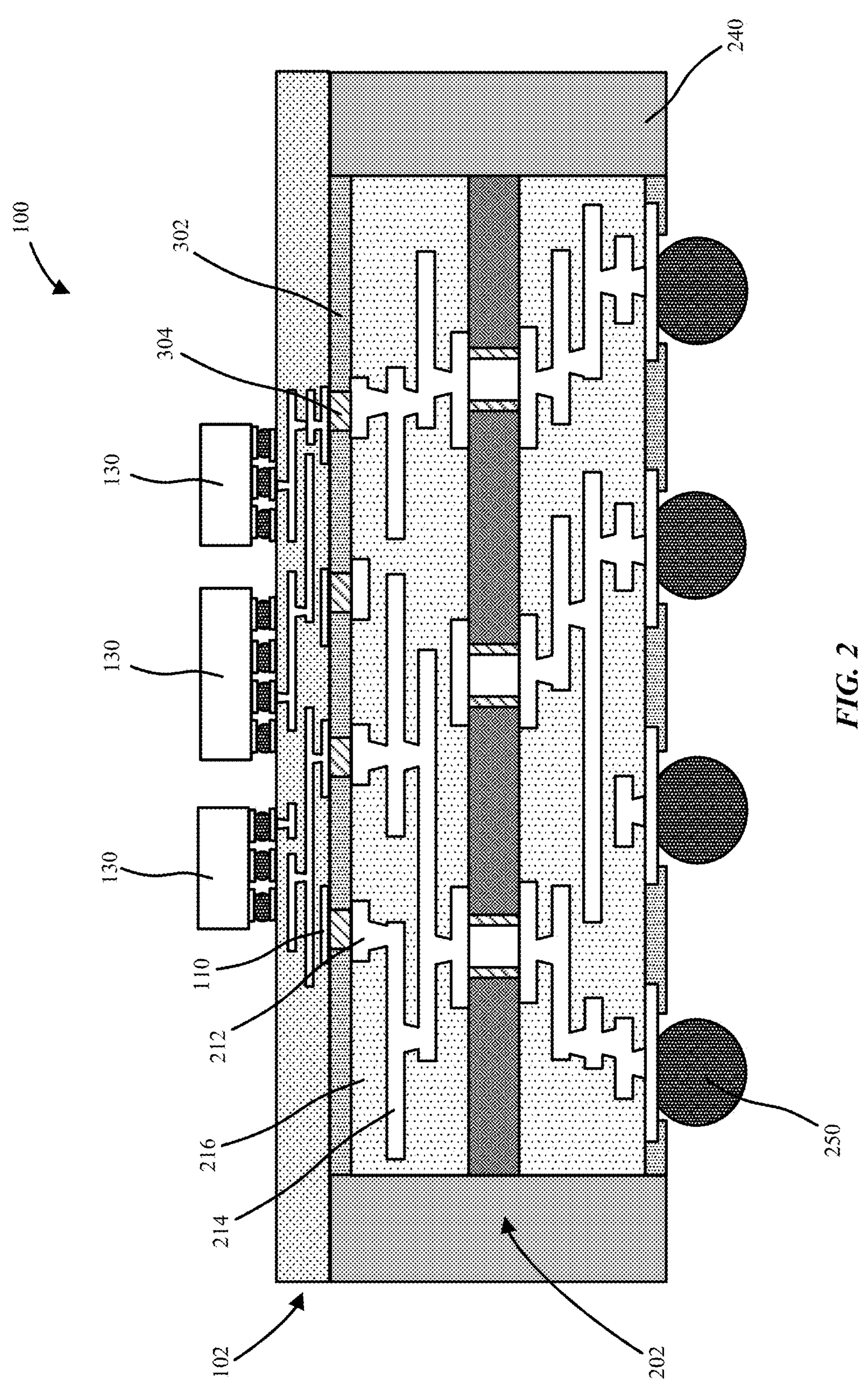
FIG. 2 is a schematic cross-sectional side view illustration of an electronic package including an interposer formed on a package substrate in accordance with an embodiment.
Figure 5A:
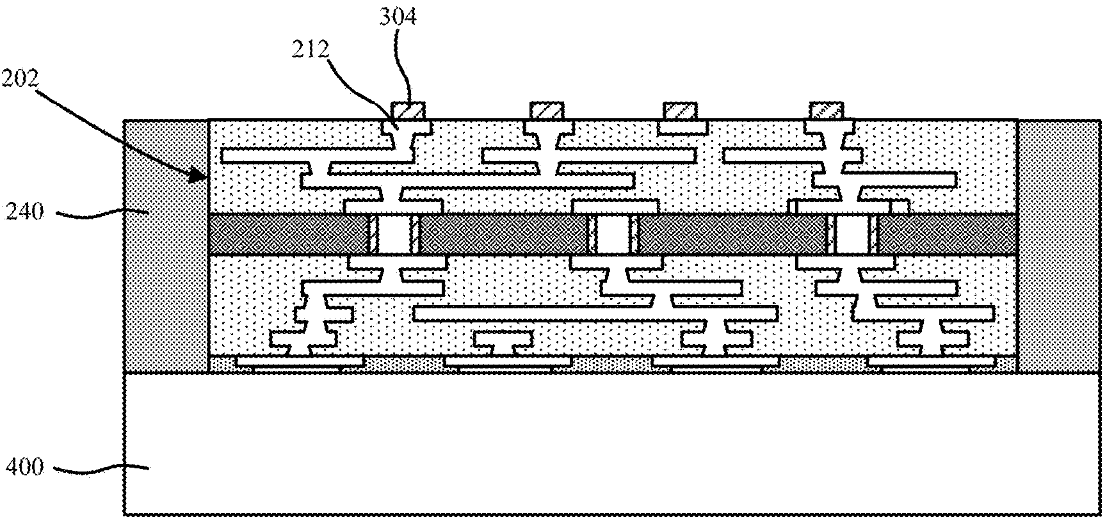
FIGS. 5A-5B are schematic cross-sectional side view illustrations of a sequence of connecting an interposer to a package substrate with a plurality of conductive pillars formed during a substrate reconstitution process in accordance with an embodiment.
Figure 5B:
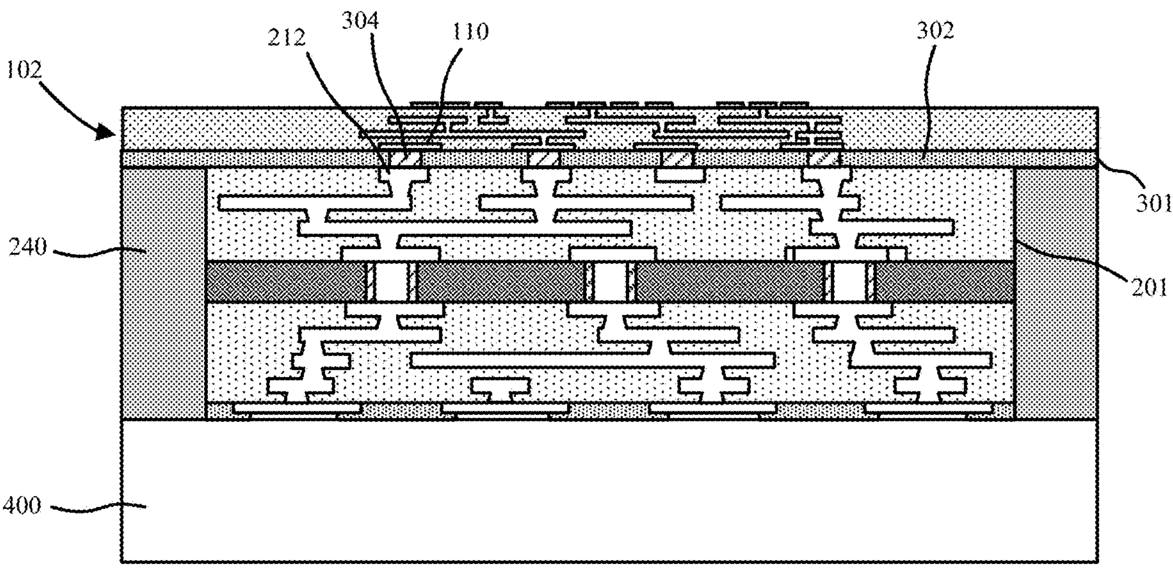

Referring now to FIG. 2, rather than placing the interposer 102 onto the package substrate 202 and joining with an intermediate conductive film 120, the interposer 102 can be formed on the package substrate 202 for example, during a reconstitution process in a layer-by-layer fashion. In the particular embodiment illustrated in FIG. 2, an electronic package 100 includes a package substrate 202, an (e.g. organic) interposer 102 on the package substrate 202, and a dielectric film 302 between the package substrate 202 and the interposer 102 with a plurality of conductive columns 304 extending through the dielectric film 302 to directly connect a plurality of contact pads 110 of the interposer 102 to a corresponding plurality of landing pads 212 of the package substrate 202. One or more dies 130 are then bonded to a top side of the interposer 102. As previously described the interposer 102 can be an organic interposer including a plurality of metal redistribution lines 214 and a plurality of polymer dielectric layers 216. Depending upon fabrication technique the dielectric film 302 may have the same width or be wider than the package substrate 202. For example, the dielectric film 302 may have the same width as the package substrate 202 when the dielectric film 302 and conductive columns 304 are formed as part of the package substrate prior to reconstitution (FIGS. 6A-6B), while the dielectric film 302 may be wider than the package substrate when the dielectric film 302 and conductive columns 304 are formed during a reconstitution process (FIGS. 5A-5B). In accordance with embodiments, the package substrate 202 may be laterally surrounded by a molding compound layer 240.

Figure 3:
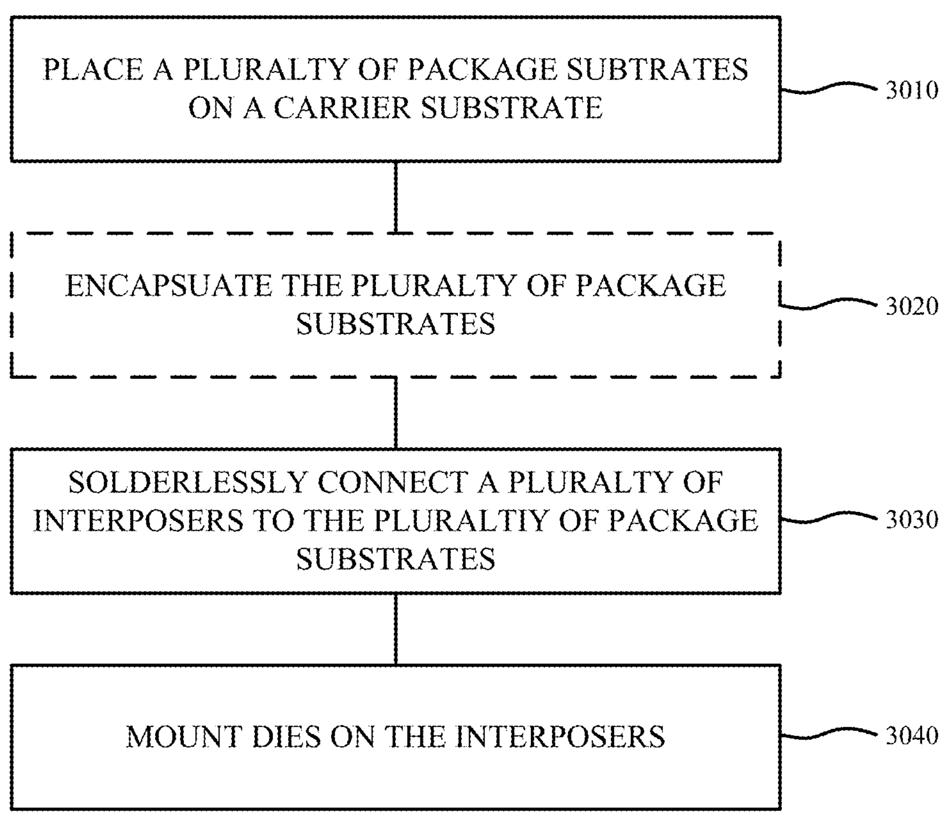
FIG. 3 is a flow chart illustrating a processing sequence for forming an electronic package with solderless connection of an interposer to a package substrate in accordance with an embodiment.

FIG. 3 is a flow chart illustrating a processing sequence for forming an electronic package 100 with solderless connection of an interposer 102 to a package substrate 202 in accordance with an embodiment. At operation 3010 a plurality of package substrates 202 are placed on a carrier substrate. The package substrates can then optionally be encapsulated in a molding compound layer 240 at operation 3020. This encapsulation may be part of a wafer reconstitution process. However, the encapsulation with a molding compound layer 240 is optional. For example, embodiments similar to FIG. 1 can be fabricated with or without the molding compound layer 240. Encapsulation with the molding compound layer 240 may be needed for embodiments similar to FIG. 2 where the deposition and patterning operations are performed to fabricate the interposers 102 over the package substrates 202. At operation 3030 a plurality of interposers 102 are connected to the plurality of package substrates 202 with solderless connections, for example, with conductive films 120 similar to FIG. 1, or a deposition (e.g. including thin film deposition or lamination techniques) and patterning sequence similar to FIG. 2. One or more dies 130 are then mounted on the interposers 102 at operation 3040.

In one aspect, the processing sequences in accordance with embodiments are die-last sequences. This allows for the integration of known good dies onto known good substrates (e.g. including the interposers and package substrates). Such a die-last approach allows completion and testing of the lower cost integrated interposers and package substrates, prior to mounting the more expensive dies. Furthermore, integration organic interposers can further reduce cost relative to silicon or glass interposers.

Figures 4A, 4B:
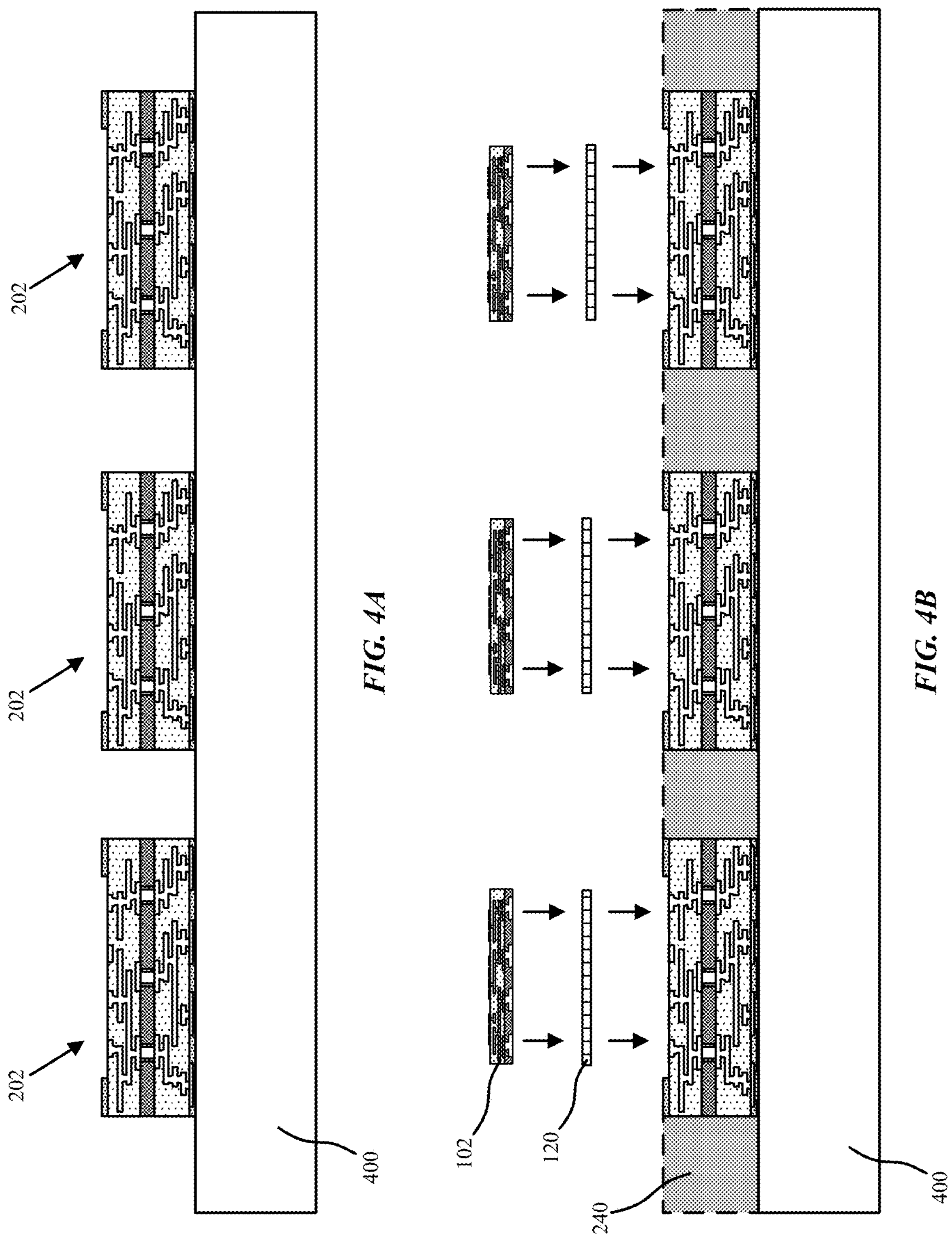
FIGS. 4A-4D are schematic cross-sectional side view illustrations of a sequence of forming an electronic package including an interposer connected to a package substrate with a conductive film in accordance with an embodiment.
Figures 4C, 4D:
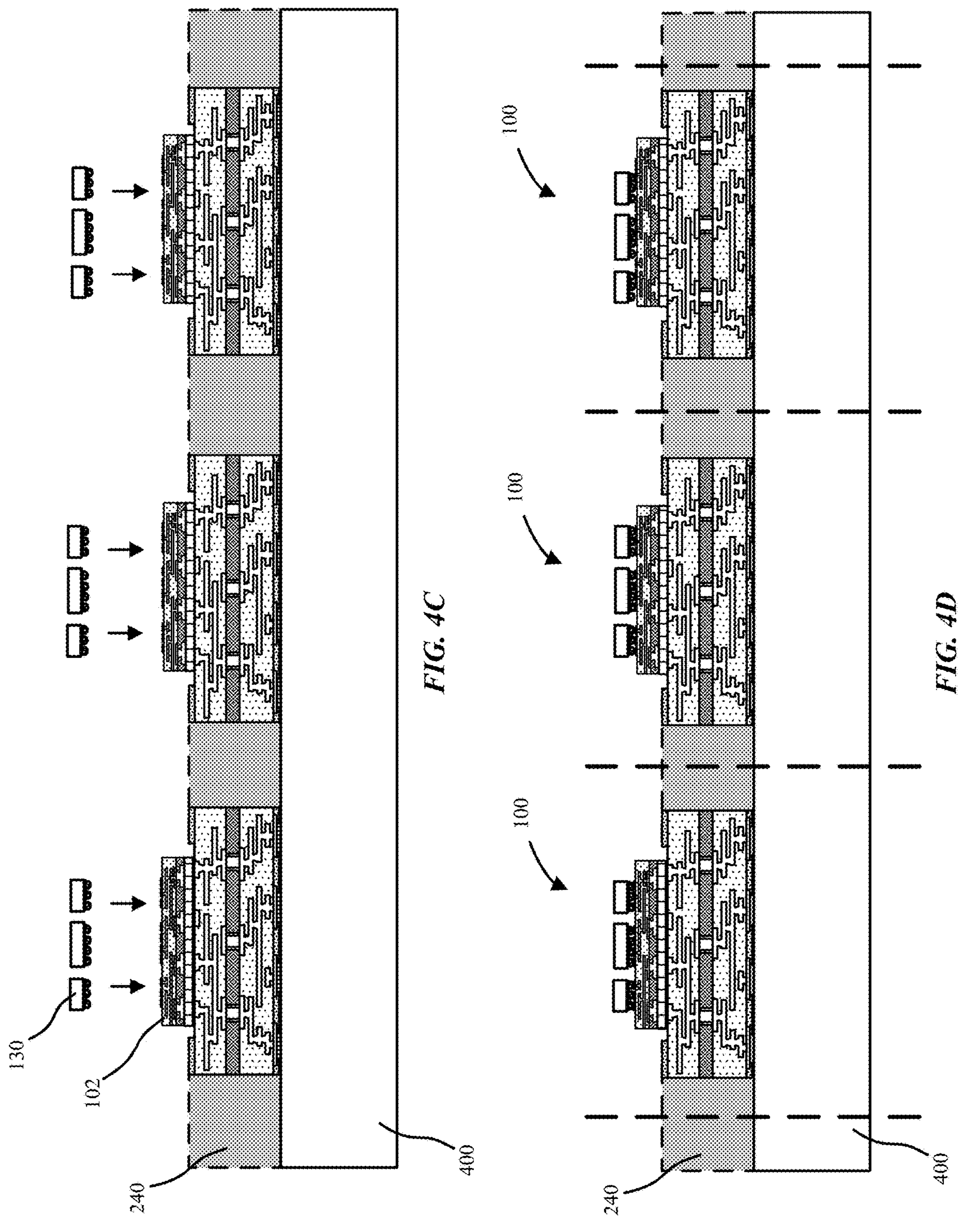

FIGS. 4A-4D are schematic cross-sectional side view illustrations of a sequence of forming an electronic package 100 similar to FIG. 1A including an interposer 102 connected to a package substrate 202 with a conductive film 120 in accordance with an embodiment. As shown in FIG. 4A, at operation 3010 a plurality of package substrates 202 are placed on a carrier substrate 400. Carrier substrate may be a variety of substates to provide rigid support during subsequent fabrication including metal, glass, silicon, etc. and provide compatibility with subsequent process equipment utilized. The package substrates 202 can then optionally be encapsulated in a molding compound layer 240 at operation 3020 as shown in FIG. 4B, followed by solderless connection of a plurality of interposers 102 are connected to the plurality of package substrates 202 at operation 3030. In the particular embodiment illustrated solderless connection is made with a plurality of individual conductive films 120 which can be mounted on the package substrates 202 along with the interposers 102 using pick and place tools and joined with application of heat and pressure. A plurality of dies 130 can then be mounted onto the interposers 102 at operation 3040, for example using pick and place tools and bonding with solder joints. Individual electronic packages 100 can then be singulated and separated from the carrier substrate 400 as shown in FIG. 4D, followed by placement of solder bumps 250 resulting in electronic packages similar to that of the embodiment illustrate in FIG. 1A.

Referring now to FIGS. 5A-5B, schematic cross-sectional side view illustrations are provided of a sequence of connecting an interposer 102 to a package substrate 202 with a plurality of conductive pillars 304 formed during a substrate reconstitution process in accordance with an embodiment. In particular FIG. 5A illustrates a close-up of operations 3010-3020 in which the plurality of package substrates 202 are placed onto the carrier substrate 400 and then encapsulated within a molding compound layer 240. In this particular processing sequence variation, a plurality of conductive columns 304 are formed on the package substrates 202, which are now part of a reconstituted substrate structure. Dielectric film 302 may be formed laterally around the conductive columns 304, or alternatively the conductive columns 304 are formed within openings in the dielectric film 302. For example, conductive columns 304 (e.g. including copper) may be formed on landing pads 212 using a plating technique. As shown in FIG. 5B, the interposers 102 are then formed over the package substrates 202 at operation 3030, followed by singulation 3040 as previously described to result in an electronic package similar to that illustrated in FIG. 2. In the resultant structure a plurality of conductive columns 304 may extend through the dielectric film 302 to directly connect a plurality of contact pads 110 of the interposer 102 to a corresponding plurality of landing pads 212 of the package substrate 202. Referring to FIG. 5B, structural distinctions may exist compared to the embodiment illustrated in FIG. 2. For example, the dielectric film 302 is wider than the package substrate 202. As shown, a lateral edge 301 of the dielectric film may extend to the package edge, while the lateral edge 201 of the package substrate 202 is laterally surrounded by the molding compound layer 240. As shown, dielectric layers from the interposer 102 can also extend to the package edge.

Figure 6A:
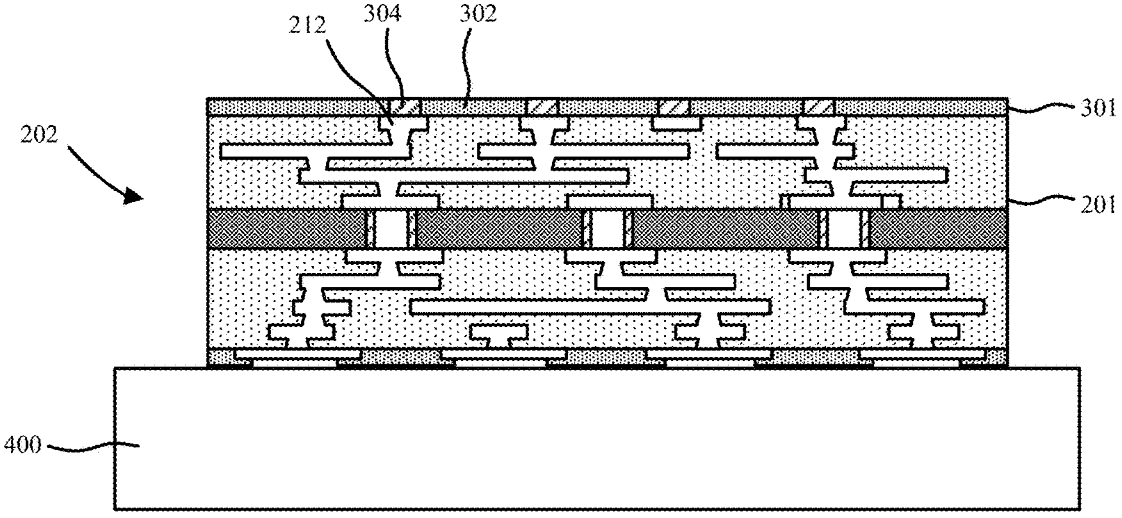
FIGS. 6A-6B are schematic cross-sectional side view illustrations of a sequence of forming an interposer on a plurality of conductive pillars of a package substrate in accordance with an embodiment.
Figure 6B:
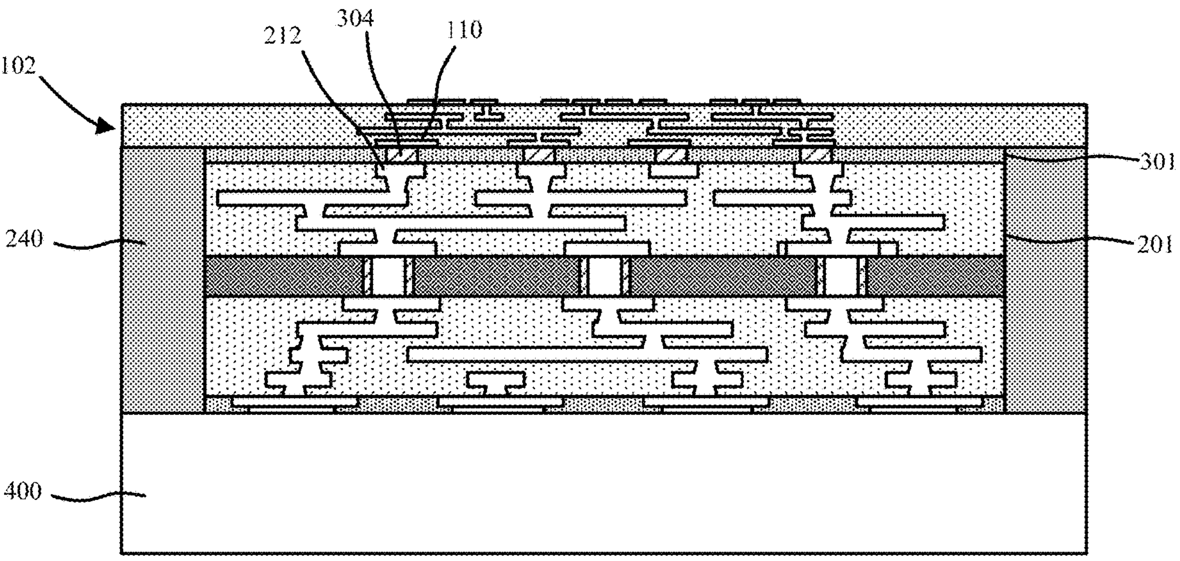

FIGS. 6A-6B are schematic cross-sectional side view illustrations of a sequence of forming an interposer 102 on a plurality of conductive pillars 304 of a package substrate 202 in accordance with an embodiment. FIGS. 6A-6B are similar to those of FIGS. 5A-5B, with one difference being that the conductive pillars 304 are pre-formed as part of the fabrication sequence of the package substrate 202. Thus, at operation 3010 placement of the package substrates 202 onto the carrier substrate 400 includes the conductive pillars 304. The dielectric layer 302 may optionally be included at this stage, or included prior to the formation of the interposers 102 at operation 3030. In an embodiment, the resultant electronic package formed using the sequence of FIGS. 6A-6B may be similar to that of FIG. 2. As such, the lateral edges 301 of the dielectric layer 302 and lateral edges 201 of the package substrates 202 may be the same.

Figure 7:
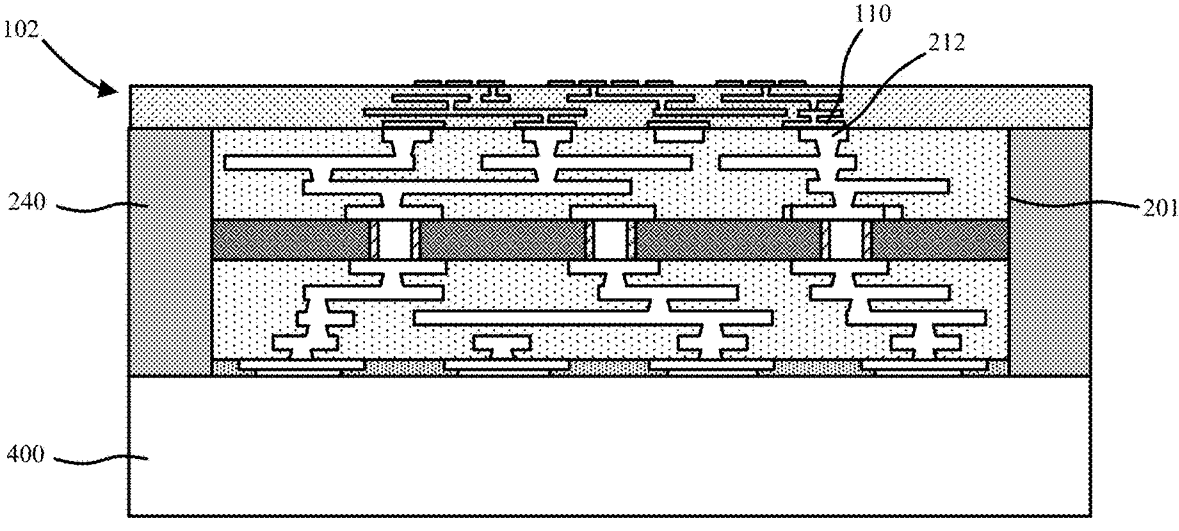
FIG. 7 is a schematic cross-sectional side view illustration of an interposer formed directly on a package substrate in accordance with an embodiment.

Referring now to FIG. 7, a schematic cross-sectional side view illustration is provided of another process variation in which an interposer 102 is formed directly on a package substrate 202 in accordance with an embodiment. In such an embodiment, the interposer 102 is formed after encapsulation with the molding compound layer 240. For example, this may include a film assisted molding technique in which a protective film is formed over the package substrates 202 during molding, then removed to expose the landing pads 212. Contact pads 110 of the interposer 102 can then be formed directly on the landing pads 212 of the package substrates 202 during fabrication of the interposers 102.

In utilizing the various aspects of the embodiments, it would become apparent to one skilled in the art that combinations or variations of the above embodiments are possible for forming an electronic package with solderless organic interposer to package substrate connection. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic package comprising:

a package substrate that has a first maximum width in a first direction between first laterally opposite edges of the package substrate;

an organic interposer bonded to the package substrate with a conductive film to electrically connect a plurality of contact pads of the organic interposer to a corresponding plurality of landing pads of the package substrate;

wherein the organic interposer includes a plurality of polymer dielectric layers, a first plurality of first metal redistribution lines, and a lower rigid layer that is thicker than each of the plurality of polymer dielectric layers or is formed of a different material than each of the plurality of polymer dielectric layers;

wherein the organic interposer has a second maximum width in the first direction between second laterally opposite edges of the organic interposer, and the second maximum width is less than the first maximum width;

wherein the conductive film includes an electrically conductive material dispersed in an adhesive insulator matrix; and one or more dies bonded to a top side of the organic interposer.

2. The electronic package of claim 1, wherein the package substrate is a cored package substrate.

3. The electronic package of claim 2, wherein the cored package substrate includes a core, a top build-up structure, and a bottom build-up structure.

4. The electronic package of claim 3, wherein the core includes electrically conductive vias extending between the top build-up structure and the bottom build-up structure.

5. The electronic package of claim 1, wherein the package substrate is a rigid substrate.

6. The electronic package of claim 5, wherein the package substrate is thicker than the organic interposer.

7. The electronic package of claim 6, wherein:

the first metal redistribution lines each have a first line width;

the package substrate includes a second plurality of second metal redistribution lines, and the second metal redistributions lines each have a second line width; and the first line width is finer than the second line width.

8. The electronic package of claim 7, wherein the one or more dies comprises a plurality of dies.

9. The electronic package of claim 8, wherein the plurality of dies is bonded to the top side of the organic interposer with a plurality of solder bumps.

10. The electronic package of claim 9, wherein the conductive film has a same width as the second maximum of the organic interposer.

11. The electronic package of claim 7, wherein the lower rigid layer is thicker than each of the plurality of polymer dielectric layers.

12. The electronic package of claim 7, wherein the lower rigid layer is formed of a different material than each of the plurality of polymer dielectric layers.

13. The electronic package of claim 7, wherein the lower rigid layer is thicker than each of the plurality of polymer dielectric layers and is formed of a same material as each of the plurality of polymer dielectric layers.

14. The electronic package of claim 1, wherein the conductive film has a same width as the second maximum of the organic interposer.

* * * * *